United States Patent
Matsumoto et al.

(10) Patent No.: US 7,139,952 B2
(45) Date of Patent: Nov. 21, 2006

(54) SEMICONDUCTOR INTEGRATED CIRCUIT DETECTING GLITCH NOISE AND TEST METHOD OF THE SAME

(75) Inventors: Takashi Matsumoto, Chiba (JP); Masaki Oiso, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 202 days.

(21) Appl. No.: 10/982,676

(22) Filed: Nov. 5, 2004

(65) Prior Publication Data
US 2005/0193300 A1  Sep. 1, 2005

(30) Foreign Application Priority Data
Feb. 27, 2004  (JP) .......................... P2004-054422

(51) Int. Cl.
  G06K 5/04   (2006.01)
  G01R 31/28  (2006.01)
  G06F 11/00  (2006.01)
(52) U.S. Cl. ................... 714/726; 714/700; 714/817
(58) Field of Classification Search ............... None
  See application file for complete search history.

(56) References Cited

U.S. PATENT DOCUMENTS

| | | | |
|---|---|---|---|
| 6,442,721 B1 | 8/2002 | Whetsel | |
| 6,594,805 B1* | 7/2003 | Tetelbaum et al. | 716/5 |
| 6,907,590 B1* | 6/2005 | Al-Dabagh et al. | 716/6 |
| 7,039,891 B1* | 5/2006 | Tetelbaum | 716/13 |
| 2002/0124218 A1* | 9/2002 | Kishimoto | 714/738 |

FOREIGN PATENT DOCUMENTS

| | | |
|---|---|---|
| JP | 2001-305191 | 10/2001 |
| JP | 2002/257903 | 9/2002 |

* cited by examiner

*Primary Examiner*—Christine T. Tu
(74) *Attorney, Agent, or Firm*—DLA Piper US LLP

(57) ABSTRACT

A semiconductor integrated circuit having a plurality of wirings and a scan chain including a testing circuit configured to detect glitch noise caused by crosstalk between the wirings and a plurality of scan flip-flops connected in series, the semiconductor integrated circuit includes a retention circuit receiving a data signal propagating a test-subject wiring, and a detection circuit receiving the data signal and an output signal of the retention circuit, detecting glitch noise occurring in the data signal, and delivering an output signal to the retention circuit.

17 Claims, 15 Drawing Sheets

FIG. 9
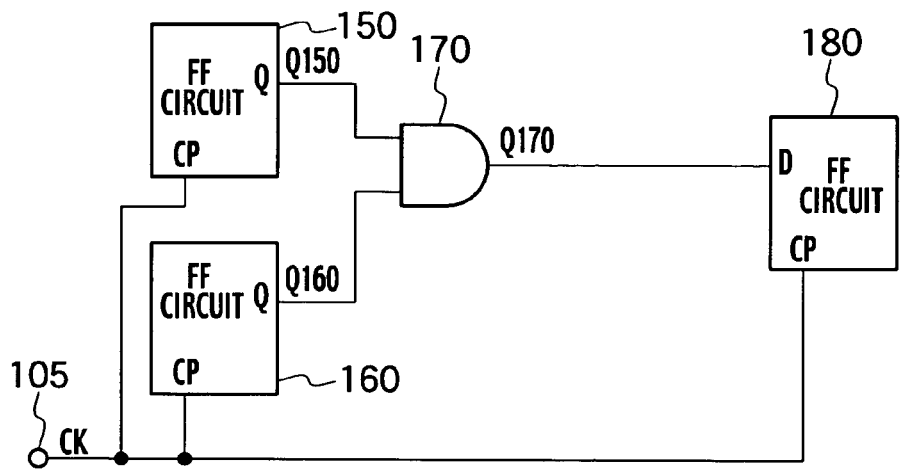
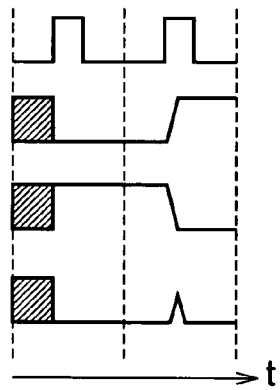
FIG. 10A  CK
FIG. 10B  Q150
FIG. 10C  Q160
FIG. 10D  Q170
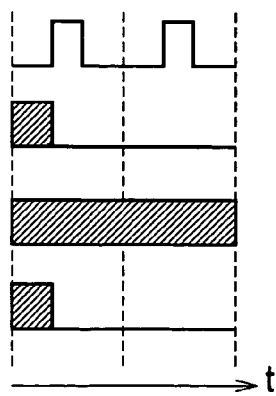
FIG. 11A  CK
FIG. 11B  Q150
FIG. 11C  Q160
FIG. 11D  Q170

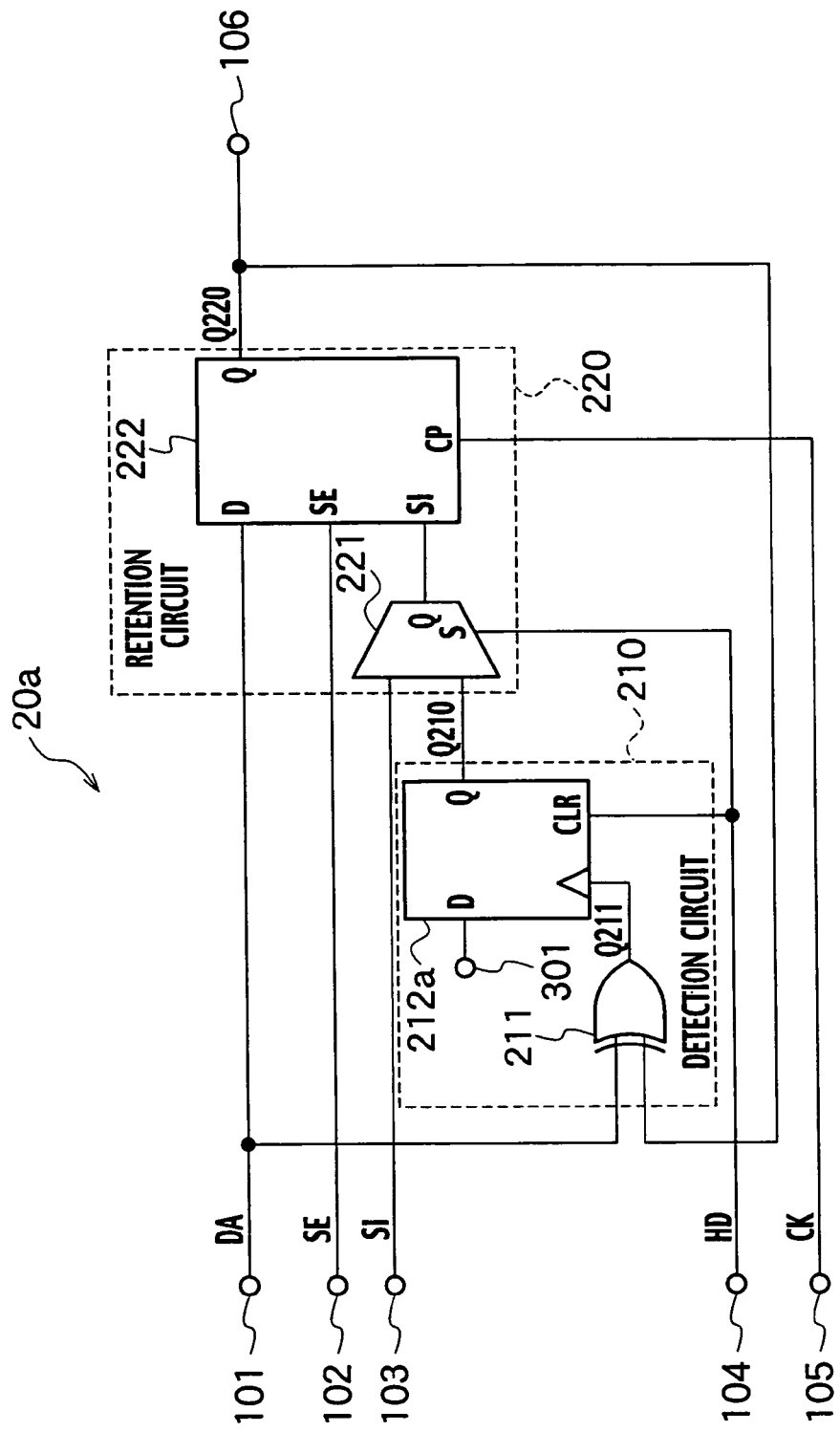

SEMICONDUCTOR INTEGRATED CIRCUIT DETECTING GLITCH NOISE AND TEST METHOD OF THE SAME

CROSS REFERENCE TO RELATED APPLICATIONS

This application is based upon and claims the benefit of priority from prior Japanese Patent Application P2004-054422 filed on Feb. 27, 2004; the entire contents of which are incorporated by reference herein.

BACKGROUND OF THE INVENTION

1. Field of the Invention

The present invention relates to a semiconductor integrated circuit test, particularly to a semiconductor integrated circuit that is configured to execute detection of glitch noise, and a testing method of the same.

2. Description of the Related Art

Because interval distance between wiring decreases in correlation with miniaturization of semiconductor integrated circuits, influences of crosstalk noise, which is caused by factors such as coupling capacitance in between wiring, on semiconductor integrated circuit properties, becomes great. Because of this, occurrences of chips having bad properties, which are caused by crosstalk noise, are problematic.

The term "crosstalk noise" refers to an occurrence of a change in signal level in a wire that is brought about by an influential change in signal level of an adjacent wire. Also related to crosstalk noise are glitch noise, and signal distortion.

"Glitch noise" is when wiring that influences adjacent wiring with noise, (referred to as "aggressor wiring" hereinafter) undergoes a signal change, generating a pulse in adjacent wiring having a fixed signal level, such a pulse corresponding to the time at which the signal level of the aggressor wiring has changed. Wiring which takes on crosstalk noise influence is termed "victim wiring". In a case in which the signal level of victim wiring is low, occurrences of glitch noise, which cause the low signal level to become high, are problematic. In a case in which the signal level of victim wiring is high, occurrences of glitch noise, which cause the high signal level to become low, are problematic.

On the other hand, the term "signal distortion" refers to a phenomenon in which in a case in which the signal level of the aggressor wiring and the victim wiring change at roughly the same time, and according to the influential change in the signal level of the aggressor wiring, the time it takes for the signal level of the victim wiring to change varies compared to a case having no influential crosstalk noise.

Crosstalk noise occurs easily in spots in which wiring adjacent one another are established parallel over long stretches. Because of this, it is possible to extract at-risk locations to an extent, during the stage of designing the schematic of semiconductor integrated circuits. By changing wiring arrangements of at-risk locations, it is possible to cut risks of crosstalk noise occurrence.

However, there are cases in which at-risk locations, which could not be extracted during designing of a wiring schematic, remain after changing target wiring arrangements. Even if not extracted as at-risk locations, there also exist cases harboring an inconvenience of crosstalk noise influence within manufactured semiconductor integrated circuits, due to fluctuations that occur during manufacturing. Because of this, it is essential to provide a test capable of detecting occurrences of crosstalk noise in a manufactured semiconductor integrated circuit.

Detection for whether or not glitch noise is occurring in victim wiring is carried out by importing signals that propagate through victim wiring, into a flip-flop of a scan testing circuit. With the above method, the time period throughout activation of the clock signal that controls the scan testing circuit is a timing window for importing data into the flip-flop. And the occurring glitch noise is detected in the timing window of the flip-flop, into which signals that propagate through victim wiring is input. However, in scan testing circuit, in order to improve the controllability of the clock signal used in a scan testing circuit, bypass circuits may be inserted into the circuitry that propagates clock signals. In such a case, clock signal timing of normal operation of a semiconductor integrated circuit, and scan test operation, differ. Because of this, glitch noise occurring during normal circuit operation is generated outside of the flip-flop timing window in the operation of the scan test, leading to cases in which detection is not possible.

There is also a method in which signals that are capable of generating glitch noise are taken in order to facilitate observation outside of a semiconductor integrated circuit, and glitch noise is detected by an outside apparatus. However, the number of possible target aggressor wirings can become limited with this method.

SUMMARY OF THE INVENTION

An aspect of the present invention inheres in a semiconductor integrated circuit having a plurality of wirings and a scan chain including a testing circuit configured to detect glitch noise caused by crosstalk between the wirings and a plurality of scan flip-flops connected in series, the semiconductor integrated circuit including a retention circuit configured to receive a data signal propagating a test-subject wiring; and a detection circuit configured to receive the data signal and an output signal of the retention circuit, to detect glitch noise occurring in the data signal, and to deliver an output signal to the retention circuit.

Another aspect of the present invention inheres in a method of testing a semiconductor integrated circuit, detecting glitch noise caused by crosstalk between a plurality of wirings, the method including setting an output signal of a retention circuit configured to receive a data signal propagating in a test-subject wiring to a same level as the data signal, the retention circuit being included in a scan chain; changing signal level of one of the plurality of wirings causing crosstalk influence on the data signal; feeding the data signal and the output signal of the retention circuit into an exclusive OR circuit; storing an output signal of the exclusive OR circuit in a memory circuit configured to hold the output signal of the exclusive OR circuit; detecting glitch noise occurring in the data signal; and feeding a signal held in the memory circuit into the retention circuit.

BRIEF DESCRIPTION OF DRAWINGS

FIG. 9 is a circuit schematic explaining a method of setting the semiconductor integrated circuit according to the embodiment of the present invention;

FIGS. 10A to 10D, are timing charts explaining a method of setting the semiconductor integrated circuit according to the embodiment of the present invention;

FIGS. 11A to 11D are other timing charts explaining a method of setting the semiconductor integrated circuit according to the embodiment of the present invention;

FIG. 12 is a block diagram showing the structure of the semiconductor integrated circuit according to a first modification of the present invention;

DETAILED DESCRIPTION OF THE INVENTION

Figure 1:
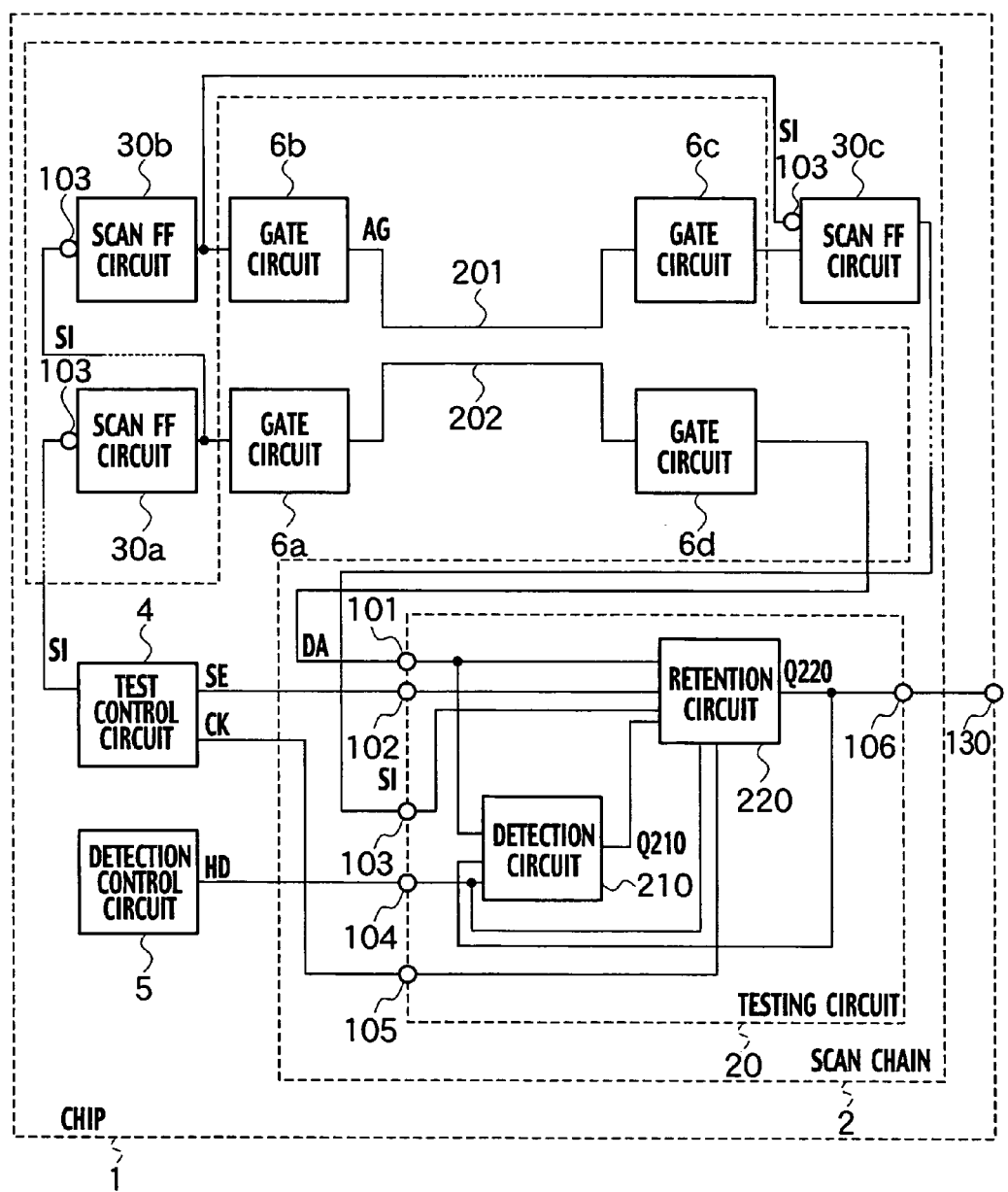
FIG. 1 is a block diagram showing the structure of a semiconductor integrated circuit according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous specific details are set fourth such as specific signal values, etc. to provide a thorough understanding of the present invention.

However, it will be obvious to those skilled in the art that the present invention may be practiced without such specific details. In other instances, well-known circuits have been shown in block diagram form in order not to obscure the present invention in unnecessary detail.

As shown in FIG. 1, a semiconductor integrated circuit according to the embodiment of the present invention includes scan chain 2 and a plurality of wirings 201, 202, -, which is integrated on the same chip 1. The scan chain 2 includes a testing circuit 20 and series connections of a plurality of scan flip-flops 30a, 30b, 30c, -, which detect glitch noise according to crosstalk in between the plurality of wirings 201, 202, -. The testing circuit 20 includes a retention circuit 220, and a detection circuit 210. The retention circuit 220 receives a data signal DA that propagates through a test-subject wiring 202, and is included in the scan chain 2. The detection circuit 210 receives the data signal DA and an output signal Q2, which is delivered from the retention circuit 220, and detects glitch noise occurring in the data signal DA. The detection circuit 210 delivers an output signal Q210 to the retention circuit 220. The test-subject wiring 202 is one of the plurality of wirings 201, 202, -.

Generally, scan testing circuits used for purposes of simplifying semiconductor integrated circuit test are usually structured of a series connection of flip-flops ("FF circuit" hereinafter) monolithically integrated on a single chip. FF circuits are added in order to facilitate shift resistor operation. Structures of FF circuits connected in series are called "scan chain". Hereinafter, FF circuits that constitute a scan chain are called "scan FF circuits".

In FIG. 1, scan FF circuits 30a, 30b, 30c, and retention circuit 220 are shown, however, the majority of the scan FF circuits 30a, 30b, 30c, -, are connected in series to constitute a scan chain 2, through wiring and gate circuits not shown in FIG. 1. In a scan testing, each of the scan FF circuits 30a, 30b, 30c, -, that constitute the scan chain 2 are set according to a scan signal SI that is delivered from previous scan FF circuits through the scan input terminal 103. Then the scan FF circuits 30a, 30b, 30c, -, deliver the scan signal SI to subsequent scan FF circuits.

In FIG. 1, an example of the retention circuit 220 being the final stage of the scan chain 2, and an external terminal 130 is connected to a data signal output terminal 106. It is possible to read scan testing results from the external terminal 130.

A test control circuit 4 delivers a capture scan clock CK, a scan enable signal SE, and the scan signal SI. The capture scan clock CK is a scan testing circuit operation standard. The scan enable signal SE sets an operation mode of the scan FF circuits 30a, 30b, 30c, -. The scan signal SI executes setting of scan FF circuits 30a, 30b, 30c, -. The scan FF circuit's term "setting of operation mode" refers to switching between a scan signal SI reading mode, and a data signal reading mode, which occurs through a data signal terminal 101. The test control circuit 4 also delivers the scan signal SI to scan FF circuits (not illustrated) of the first stage of the scan chain 2. The capture scan clock CK is delivered to the testing circuit 20 through the chip scan clock terminal 105. The testing circuit 20 receives the scan enable signal SE through the scan enable terminal 102. And the scan signal SI is delivered from the previous scan FF circuit (not illustrated) of the testing circuit 20 on the scan chain 2. The testing circuit 20 receives the scan signal SI through the scan input terminal 103. In FIG. 1, illustration of wiring connecting the test control circuit 4 and the scan FF circuits 30a, 30b, 30c, -, has been omitted.

A detection control circuit 5 delivers a hold control signal HD, which controls operation of the testing circuit 20. The testing circuit 20 receives the hold control signal HD through a hold terminal 104. As shown in FIG. 1, the scan FF circuit 30a and a gate circuit 6a are connected. The gate circuit 6a and a gate circuit 6d are connected by the test-subject wiring 202. And the gate circuit 6d and the testing circuit 20 are connected. A gate circuit 6b and a gate circuit 6c are connected by the wiring 201. Further, the gate circuit 6c and the scan FF circuit 30c are connected. And there are other wirings (not illustrated) connected to the scan FF circuit 30b and the scan FF circuit 30a.

In an example case in which the wiring 201 is aggressor wiring and the test-subject wiring 202 is victim wiring, the testing circuit 20 detects glitch noise occurring in the test-subject wiring 202. Put plainly, if the output signal of the scan FF circuit 30b changes, the output signal AG of the gate circuit 6b will change. Output signal AG propagates through the wiring 201 and is input to the scan FF circuit 30c through the gate circuit 6c. The signal that propagates through the test-subject wiring 202 will undertake crosstalk influence according to changes in the level of the output signal AG that propagates through the wiring 201. The signal that propagates through the test-subject wiring 202 is input into the testing circuit 20 through the gate circuit 6d. And according to the method and put forth herein below, the testing circuit 20 detects whether or not occurrences of glitch noise are present at the test-subject wiring 202. Detection results are held at the retention circuit 220. It is possible to read values held at the retention circuit 220 from the external terminal 130 using the scan chain 2. Thus it is possible to detect occurrences of glitch noise at the test-subject wiring 202.

In the above description, a case detecting occurrences of glitch noise at the test-subject wiring 202 with the testing circuit 20 has been put forth as an example. However it is possible that anyone of the scan FF circuits 30a, 30b, 30c, -, can be input with victim wiring signals. Because of this, it is acceptable to apply the testing circuit 20 to either or all of the scan FF circuits 30a, 30b, 30c, -. For example, apply the testing circuit 20 to the scan FF circuit 30c. As a result, It is possible to detect glitch noise occurring at the wiring 201 caused by crosstalk influence generated by changes in the signal level of adjacent wiring. For example, it is possible to apply common single phase scan FF circuits (multiplexed type scan FF circuits) for the scan FF circuits 30a, 30b, 30c, -.

Figure 2:
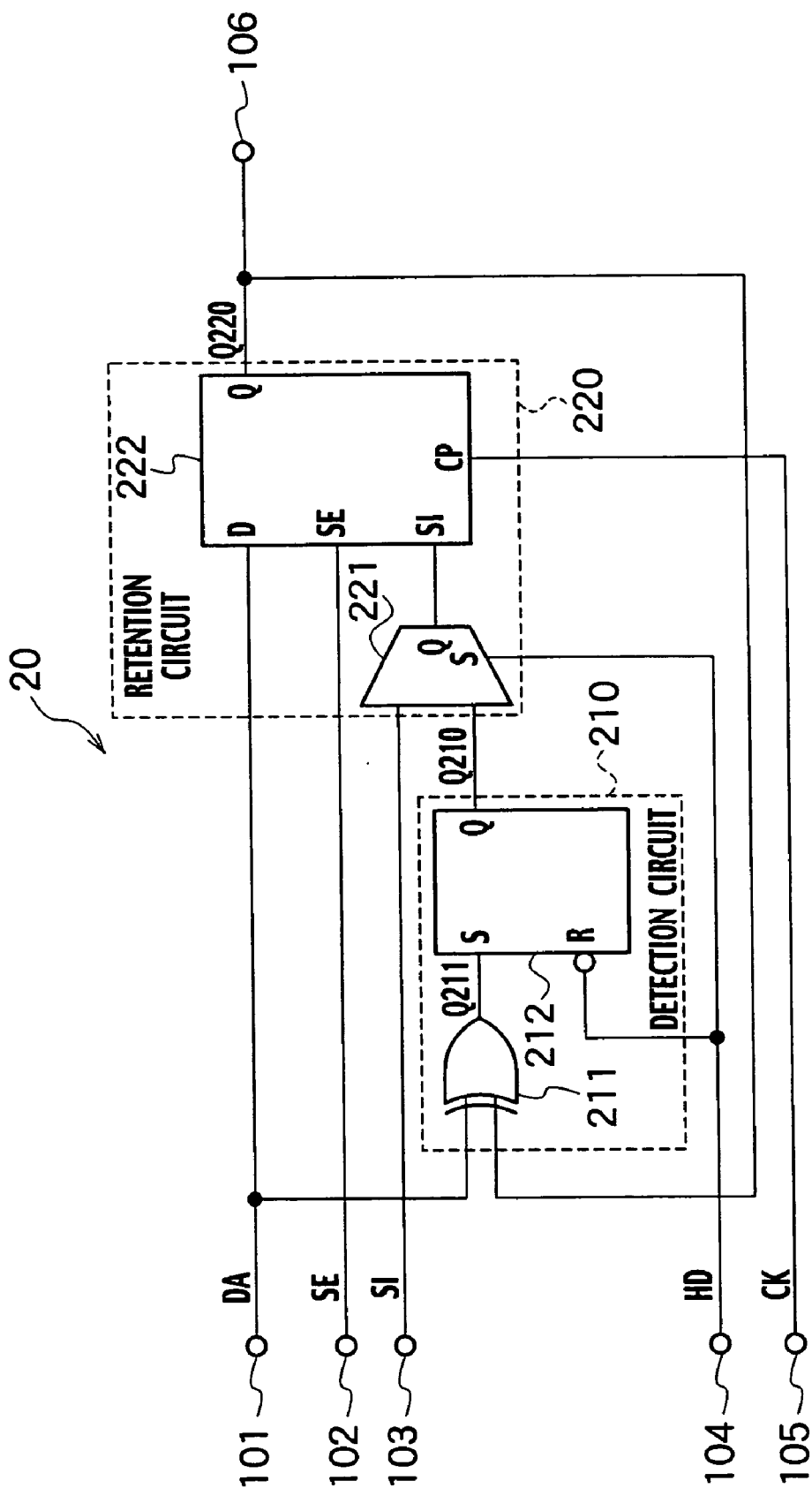
FIG. 2 is a block diagram showing part of the structure of a semiconductor integrated circuit according to the embodiment of the present invention.

Next, structure of the testing circuit 20 will be described using FIG. 2. As shown in FIG. 2, the retention circuit 220 includes a multiplexer 221 and a common single phase scan FF circuit 222. A data terminal D of the common single phase scan FF circuit 222 is connected to the data signal terminal 101, and the scan enable terminal SE is connected to the scan enable terminal 102. Further, an output terminal Q of the common single phase scan FF circuit 222 is connected to the 106, and an output signal Q220 is delivered through the data signal output terminal 106.

An output signal Q210 of the detection circuit 210 is delivered to an input terminal of one side of the multiplexer 221, and a scan signal is input to an input terminal of the other side of the multiplexer 221 through the scan input terminal 103. The multiplexer 221 is a 2 input 1 output multiplexer that selects one among two signals input to the two input terminals by a signal input to a select terminal S, and delivers the selected signal from the output terminal Q. The hold terminal 104 is connected to the select terminal S, and a scan input terminal SI of the common single phase scan FF circuit 222 is connected to the output terminal Q.

The detection circuit 210 includes an exclusive OR (EXOR) circuit 211, and a latch circuit 212. The data signal terminal 101 and the output terminal Q of the common single phase scan FF circuit 222 are connected to an input terminal of the EXOR circuit 211. The latch circuit 212 is employed as a kind of a memory circuit.

An output terminal of the EXOR circuit 211 is connected to a set terminal S of the latch circuit 212. And an output signal Q211 of an output terminal of the EXOR circuit 211 is input to the latch circuit 212 through the set terminal S. The hold terminal 104 is connected to a reset terminal R. In a case in which a signal is input to both the set terminal S and the reset terminal R simultaneously, the signal input to the reset terminal R is given priority, thus the latch circuit 212 acts as a set reset (SR) latch circuit. One of the input terminals of the multiplexer 221 is connected to the output terminal Q of the latch circuit 212.

In the testing circuit 20 shown in FIG. 2, one of the scan signal SI used in scan testing, and the output signal Q210 of the detection circuit 210 that holds glitch noise detection signals, are selected by the multiplexer 221, and input to a scan input terminal SI of the common single phase scan FF circuit 222. Because of this, even if the detection circuit 210 is added to, functions of the common single phase scan FF circuit 222 in scan testing will not be lost.

Because the relationship between changes in signal level of the aggressor wiring and polarity of glitch noise occurring in the victim wiring depends upon the state of mutual conductivity between the aggressor wiring and the victim wiring, the state of mutual capacity and the wiring state, it is impossible to uniquely determine. Put plainly, in a case in which the signal level of victim wiring is fixed low, there are instances of glitch noise generation that arise when the victim wiring is influenced to a high level by crosstalk noise from aggressor wiring changing from high to low level ("high glitch noise" hereinafter), or from low to high level.

Similarly, in a case in which the signal level of victim wiring is fixed high, there are instances of glitch noise generation that arise when the victim wiring is influenced to a low level by crosstalk noise from aggressor wiring changing from high to low level ("low glitch noise" hereinafter), or from low to high level.

Therefore, it is essential to detect glitch noise considering the combination of the fixed signal level of victim wiring and changes in the signal level of aggressor wiring. Next, method of setting the combination of victim wiring signal level and changes in aggressor wiring signal level in a detecting glitch noise will be described using FIGS. 3 through 6.

Figure 3:
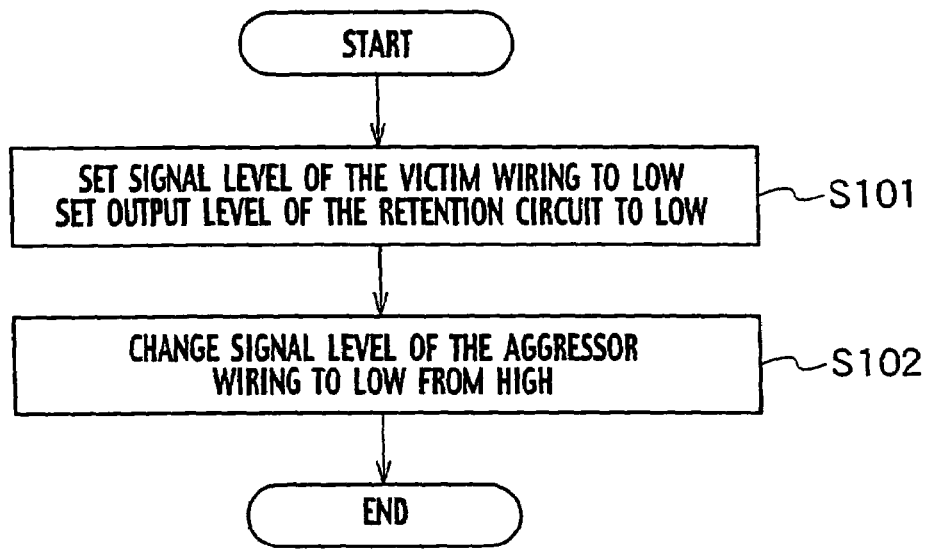
FIG. 3 is a flowchart showing an example of a setting method of a scan testing circuit used on the semiconductor device according to the embodiment of the present invention.

In a case in which the signal level of victim wiring is low, in a step S101 of FIG. 3, the output level of the memory circuit of the scan testing circuit that victim wiring signals propagate through is set to low in order to detect occurrences of high glitch noise at victim wiring. Next, in a step S102, signal level of aggressor wiring is changed from high to low. And in a step S101 of FIG. 4, setting is executed in the same manner as in the step S101 of FIG. 3, and in the following step S102, the signal level of aggressor wiring is changed from low to high.

Figure 5:
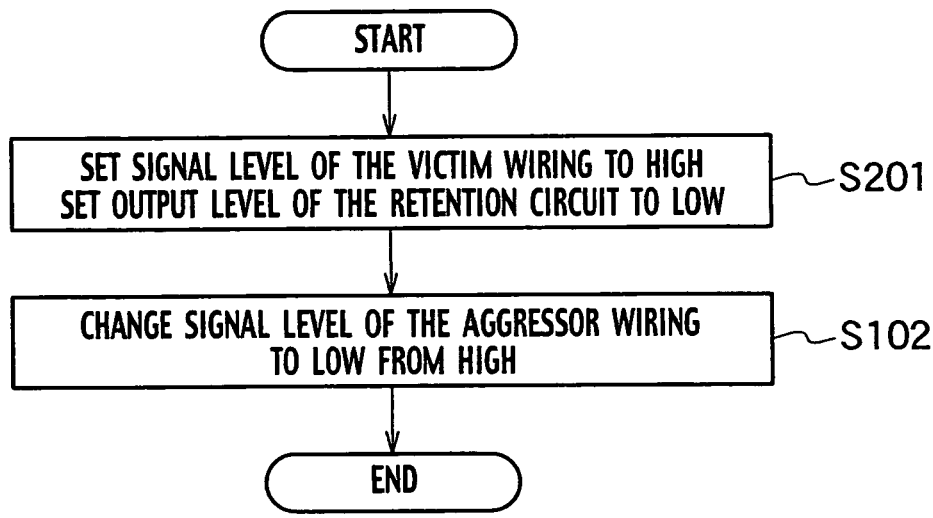
FIG. 5 is a flowchart showing still another example of a setting method of a scan testing circuit used on the semiconductor device according to the embodiment of the present invention.

In a case in which the signal level of victim wiring is high, in a step S201 of FIG. 5, the output level of the memory circuit of the scan testing circuit that victim wiring signals propagate through is set to high in order to detect occurrences of low glitch noise at victim wiring. Next, in the step S102, signal level of aggressor wiring is changed from high to low. And in a step S201 of FIG. 6, setting is executed in the same manner as in the step S201 of FIG. 5, and in the following step S202, the signal level of aggressor wiring is changed from low to high.

Next, a method of detecting glitch noise with the testing circuit 20 shown in FIG. 2 will be described using the flowchart shown in FIG. 7, and the timing chart shown in FIGS. 8A to 8H. In the following description, a case detecting high glitch noise occurring in the data signal DA caused by influences of crosstalk, in a case in which signal level of output signal AG of wiring 201 changes from high to low, will be described. Put plainly, an example executing setting shown in FIG. 3 will be described. The time chart shown in FIGS. 8A to 8H, illustrates a case in which it is indefinite whether each signal level is high or low, by a diagonal line.

Figure 7:
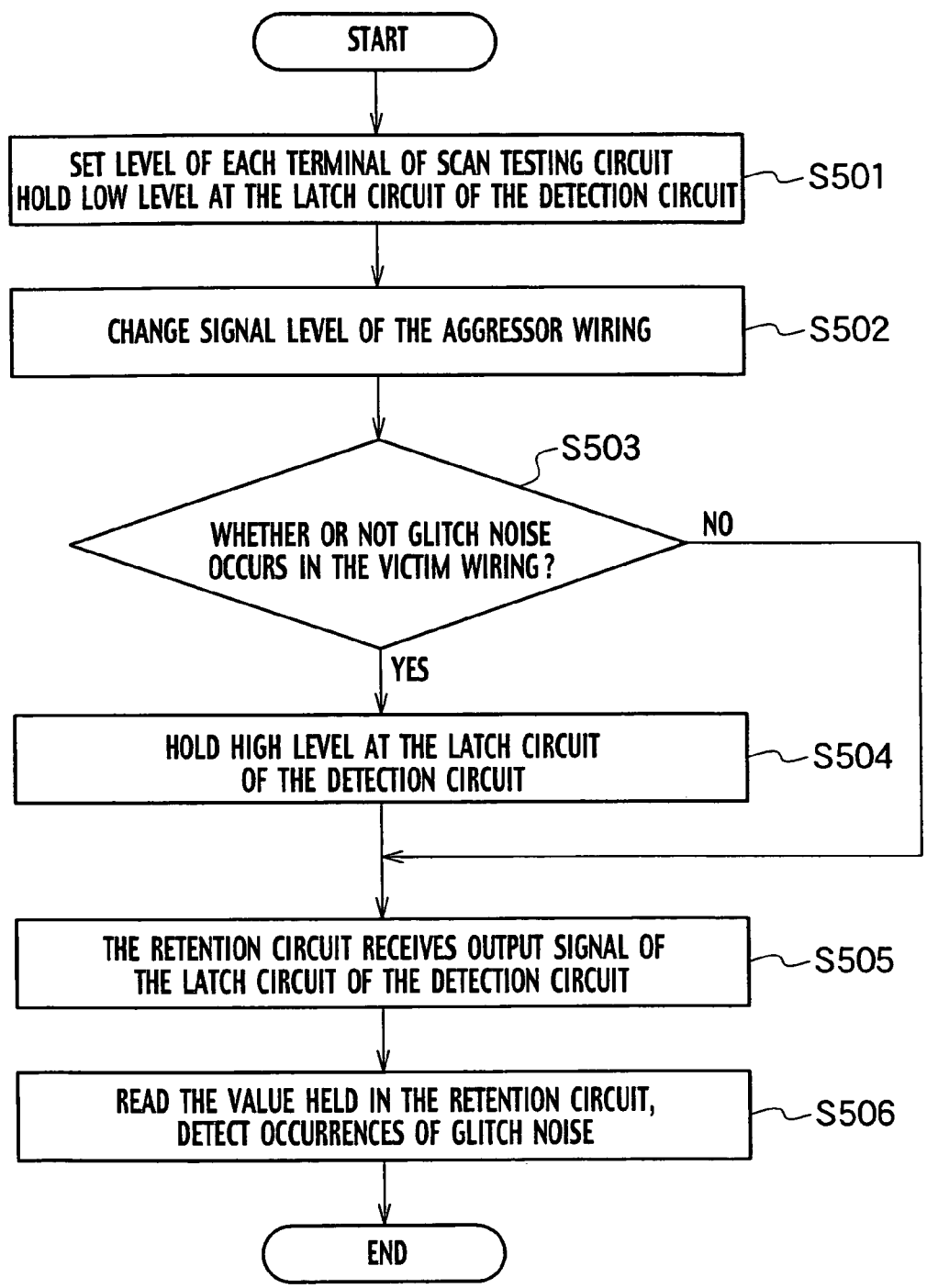
FIG. 7 is a flowchart showing a test method using the semiconductor integrated circuit according to the embodiment of the present invention.

(a) In step S501 of FIG. 7, signal level of hold control signal HD is set to low, as shown in time t1 to t2 of FIG. 8H. The hold control signal HD is set in order that the scan signal SI that propagates through the scan input terminal 103 is input to the scan input terminal SI of the common single phase scan FF circuit 222 through the multiplexer 221. Therefore, the hold control signal HD is set to high level depending upon circuit structure. The following description is similar. The hold control signal HD is input into the reset terminal R of the latch circuit 212, and the value held at the latch circuit 212 is set to low level. Put plainly, because the latch circuit 212 of FIG. 2 is reset by a low level input to the reset terminal R, the low level value is held at the latch circuit 212 in times when the hold control signal HD is low level. Further, the data signal DA, and the output signal Q220 of the output terminal Q of the common single phase scan FF circuit 222 are each set to a low level. Time t1 to t2 are termed "scan load cycle". In the scan load cycle values held at scan FF circuits 30a, 30b, 30c, -, that constitute the scan chain 2, and values output from the scan FF circuits 30a, 30b, 30c, -, are set to a prescribed value.

Figure 8:
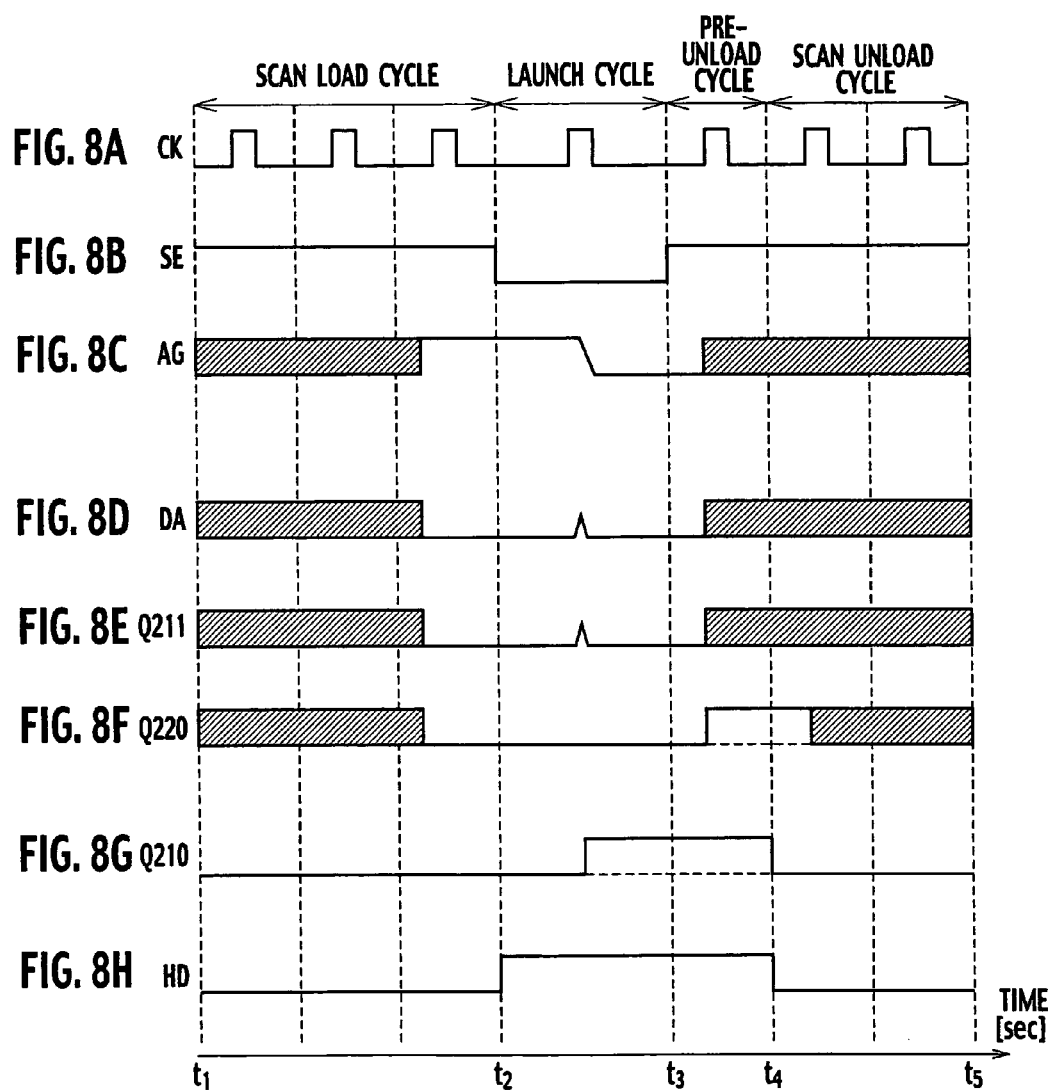
FIGS. 8A to 8H are timing charts explaining the test method used in the semiconductor integrated circuit according to the embodiment of the present invention.

(b) In step S502, the output signal AG of the wiring 201 changes from a high level to a low level, under control of the capture scan clock CK, as shown in time t2 to t3 of FIG. 8A. At this time, scan enable signal SE is set to a low level in order to scan test. By setting scan enable signal SE to a low level, values of the data terminal D of the common single phase scan FF circuit 222 are held when the capture scan clock CK changes. Setting is executed in such a way that the latch circuit 212 is removed from the reset state by setting the hold control signal HD to a high level, and the output signal Q210 of the output terminal Q of the latch circuit 212 is determined by the input signal to the set terminal S of the latch circuit 212. And because hold control signal HD is high level, the output signal Q210 of the output terminal Q of the latch circuit 212 is input to the scan input terminal SI of the common single phase scan FF circuit 222 through the multiplexer 221. Time t2 to t3 of FIG. 8 are termed "launch cycle".

(c) In step S503, the method put forth herein below determines whether or not high glitch noise, which causes malfunctions in integrated circuitry on the chip 1, occurs in on data signal DA caused by changes in the level of the output signal AG of the wiring 201. In a case in which high glitch noise is determined to be occurring on the data signal DA, in step S504, the level of output signal Q210 of the output terminal Q of the latch circuit 212 becomes high. In a case in which high glitch noise is determined to be absent on the data signal DA, step S505 succeeds. Here, the method used to determine whether or not high glitch noise occurs in on data signal DA will be described. First the data signal DA is input into the EXOR circuit 211. High glitch noise occurs on the data signal DA, and in a case in which the size of the high glitch noise is larger than a threshold value of the EXOR circuit 211, it is determined that high glitch noise occurs in the data signal DA. At this time, a low level signal is being input to one of the input terminals of the EXOR circuit 211 that has the output terminal Q of the common single phase scan FF circuit 222 connected. Because of this, a high level signal is delivered from the output terminal of the EXOR circuit 211. As a result, the output signal Q210 of the output terminal Q of the latch circuit 212 remains at a low level, as shown by a broken line in FIG. 8G.

(d) In step S505, the scan enable signal SE is set to high level, and the hold control signal HD maintains a high level, as shown in time t3 to t4 of FIG. 8B and FIG. 8H. The value of the output signal Q210 of the latch circuit 212 propagates throughout the multiplexer 221 under control of the capture scan clock CK. Then the common single phase scan FF circuit 222 receives the value of the output signal Q210 through the scan input terminal SI. In a case in which high glitch noise is determined to be occurring on the data signal DA, because the output signal Q210 of the latch circuit 212 is at a high level, the value input to the common single phase scan FF circuit 222 is at a high level. On the other hand, in a case in which high glitch noise is determined to be absent on the data signal DA, the output signal Q210 of the latch circuit 212 is at a low level. As a result, the value input to the common single phase scan FF circuit 222 is a low level, as shown by a broken line in FIG. 8G. The time t3 to t4 in which output signal Q210 of the latch circuit 212 is input to the common single phase scan FF circuit 222 is termed "pre-unload cycle".

(e) In step S506, the hold control signal HD is set to low level, as shown in time t4 to t5 of FIG. 8H. As a result, the scan signal SI is input to the common single phase scan FF circuit 222 through the multiplexer 221. Afterward, using the scan chain 2, the value held in the common single phase scan FF circuit 222 is read from the external terminal 130. The time t4 to t5 in which the value held in the common single phase scan FF circuit 222 is read out by the scan chain 2 is termed "scan unload cycle".

If the value held at the common single phase scan FF circuit 222 is at a high level, it is possible to determine that high glitch noise is occurring on the data signal DA. Therefore, it is possible to detect occurrences of high glitch noise on victim wiring using the method put forth hereinabove. And in a case in which high glitch noise is determined to be occurring on the data signal DA in the testing circuit 20 shown in FIG. 2, the data held by the latch circuit 212 changes. Because of this, it is possible to detect high glitch noise regardless of the timing window in scan testing of the common single phase scan FF circuit 222 controlled by the capture scan clock CK.

Figure 4:
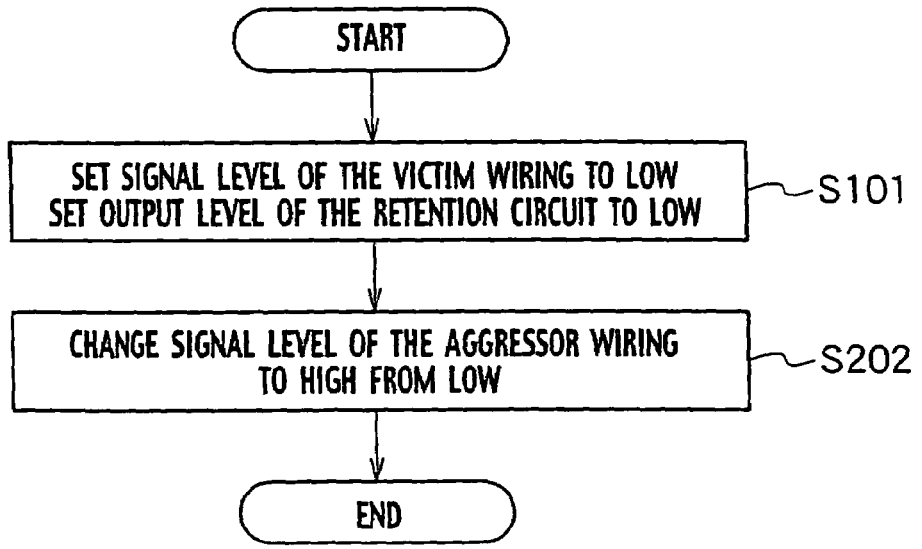
FIG. 4 is a flowchart showing another example of a setting method of a scan testing circuit used on the semiconductor device according to the embodiment of the present invention.
Figure 6:
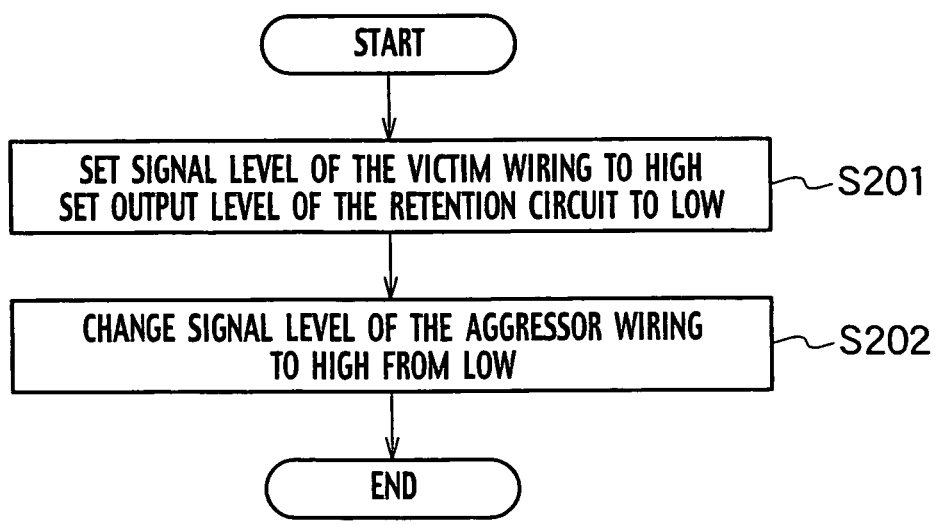
FIG. 6 is a flowchart showing yet still another example of a setting method of a scan testing circuit used on the semiconductor device according to the embodiment of the present invention.

In the description put forth hereinabove, an example of executing detection of occurrences of high glitch noise on the data signal DA has been described according to the settings of FIG. 3. Specifically, settings of changing the output signal AG of the wiring 201 from high level to low level, and fixing the data signal DA to a low level. A method of detecting occurrences of glitch noise using the testing circuit 20 according to the settings shown in FIGS. 4 to 6 is fundamentally identical to the description put forth hereinabove. Differing points lie in setting of the level of the data signal DA and the output signal Q220 of the common single phase scan FF circuit 222 in the scan load cycle shown in FIG. 8D and FIG. 8F, and setting of changes in the output signal AG in the launch cycle shown in FIG. 8C.

However, in either of the setting methods shown in FIGS. 3 to 6, the signal level of the data signal DA and the signal level of the output signal Q220 of the common single phase scan FF circuit 222 are fixed at an identical high or low level.

As a result, the output signal Q211 of the EXOR circuit 211 that is input with the data signal DA and the output signal Q220 of the common single phase scan FF circuit 222, assumes a low level. This point is common to the setting methods shown in FIGS. 3 to 6.

Therefore, in a case in which there is glitch noise occurring on the data signal DA, the level of the output signal Q211 of the EXOR circuit 211 becomes high and the latch circuit 212 holds a high level in the launch cycle of FIG. 8G. Afterward, by reading the output signal Q210 of the latch circuit 212 in the common single phase scan FF circuit 222 on the pre unload cycle, the common single phase scan FF circuit 222 will hold a high level in either of the setting methods shown in FIGS. 3 to 6.

It is impossible for the testing circuit 20 shown in FIG. 2 to distinguish between glitch noise occurring from crosstalk influence and glitch noise occurring independent of crosstalk influence. Because of this, it is essential to execute setting of a test subject circuit in order that crosstalk related and un-related glitch noise does not occur. There exist cases in which glitch noise that is not related to crosstalk influence occurs on the data terminal D of the testing circuit 20 depending upon the structure, setting, and combination of the test subject circuit.

Such an example is described using FIG. 9 and FIGS. 10A to 10D. For ease of description, only wiring that connects an output terminal Q of an FF circuit 150, an output terminal Q of an FF circuit 160 and an input terminal of an AND circuit 170, wiring that connects an output terminal of the AND circuit 170 and a data terminal D of an FF circuit 180, and wiring that propagates the capture scan clock CK has been included in the illustrations, illustration of all other wiring has been omitted in FIG. 9. The FF circuit 150, the FF circuit 160, and the FF circuit 180 can all be implemented by the common single phase scan FF circuit 222.

In FIG. 9, the capture scan clock CK is input and an output signal Q150 of the output terminal Q of the FF circuit 150 changes from low level to high level. And setting is executed to change an output signal Q160 of the output terminal Q of the FF circuit 160 from high level to low level. Normally, an output signal Q170 of the AND circuit 170 remains at a low level, and does not change before or after input of the capture scan clock CK. However, depending on the timing at which output signals of the FF circuit 150 and the FF circuit 160 are input to the AND circuit 170, high glitch noise will occur in the output signal Q170 of the AND circuit 170, as shown in FIG. 10D. And there is a possibility that high glitch noise occurring in the output signal Q170 of the AND circuit 170 will propagate through the data terminal D of the FF circuit 180.

FIGS. 11A to 11D shows an example of a setting in which even if the capture scan clock CK is not input into the FF circuit 150, the output signal Q150 of the output terminal Q of the FF circuit 150 remains at a low level unchanged. As shown in FIG. 11D, regardless of the level of the output signal Q160 of the output terminal Q of the FF circuit 160, glitch noise does not occur on the output signal Q170 of the AND circuit 170. It is essential to set a test subject semiconductor integrated circuit in order that crosstalk influence related and non-related glitch noise does not occur on victim wiring.

According to the semiconductor integrated circuit according to the embodiment of the present invention, it is possible to execute detection of glitch noise occurring in the data signal DA caused by crosstalk influence, and hold detection results in the common single phase scan FF circuit 222 regardless of the scan test timing window of the common single phase scan FF circuit 222. Furthermore, it is also possible to read out detection results held in the common single phase scan FF circuit 222 using the scan chain 2.

<First Modification>

In the semiconductor integrated circuit according to a first modification of the embodiment of the present invention, the detection circuit 210 includes a D-type FF circuit 212a in place of the latch circuit 212. This point differs from FIG. 2. As shown in FIG. 12, a data terminal D of the D-type FF circuit 212a is connected to a setting terminal 301, and a clock terminal of the D-type FF circuit 212a is connected to an output terminal of the EXOR circuit 211. Further, a clear terminal CLR of the D-type FF circuit 212a is connected to the hold terminal 104, and the output terminal Q is connected to an input terminal of the multiplexer 221. By setting the setting terminal 301 to high level, the output of the EXOR circuit 211 received through the clock terminal of the D-type FF circuit 212a is held at the D-type FF circuit 212a in correspondence with the hold control signal HD input through the clear terminal CLR. Put plainly, the set terminal S of the latch circuit 212 shown in FIG. 2 corresponds with the clock terminal of the D-type FF circuit 212a shown in FIG. 12. And the reset terminal R of the latch circuit 212 corresponds to the clear terminal CLR of the D-type FF circuit 212a.

Therefore, the D-type FF circuit 212a shown in FIG. 12 executes circuit operation in substantially the same manner as the latch circuit 212 shown in FIG. 2. Because of this, according to a testing circuit 20a shown in FIG. 12, it is possible to hold data signal DA glitch noise detection results in the common single phase scan FF circuit 222 and read out the detection results using the scan chain 2. Other points of the testing circuit 20a are fundamentally equivalent to that of the testing circuit 20 shown in FIG. 2, and so redundant mention has been omitted.

<Second Modification>

Figure 13:
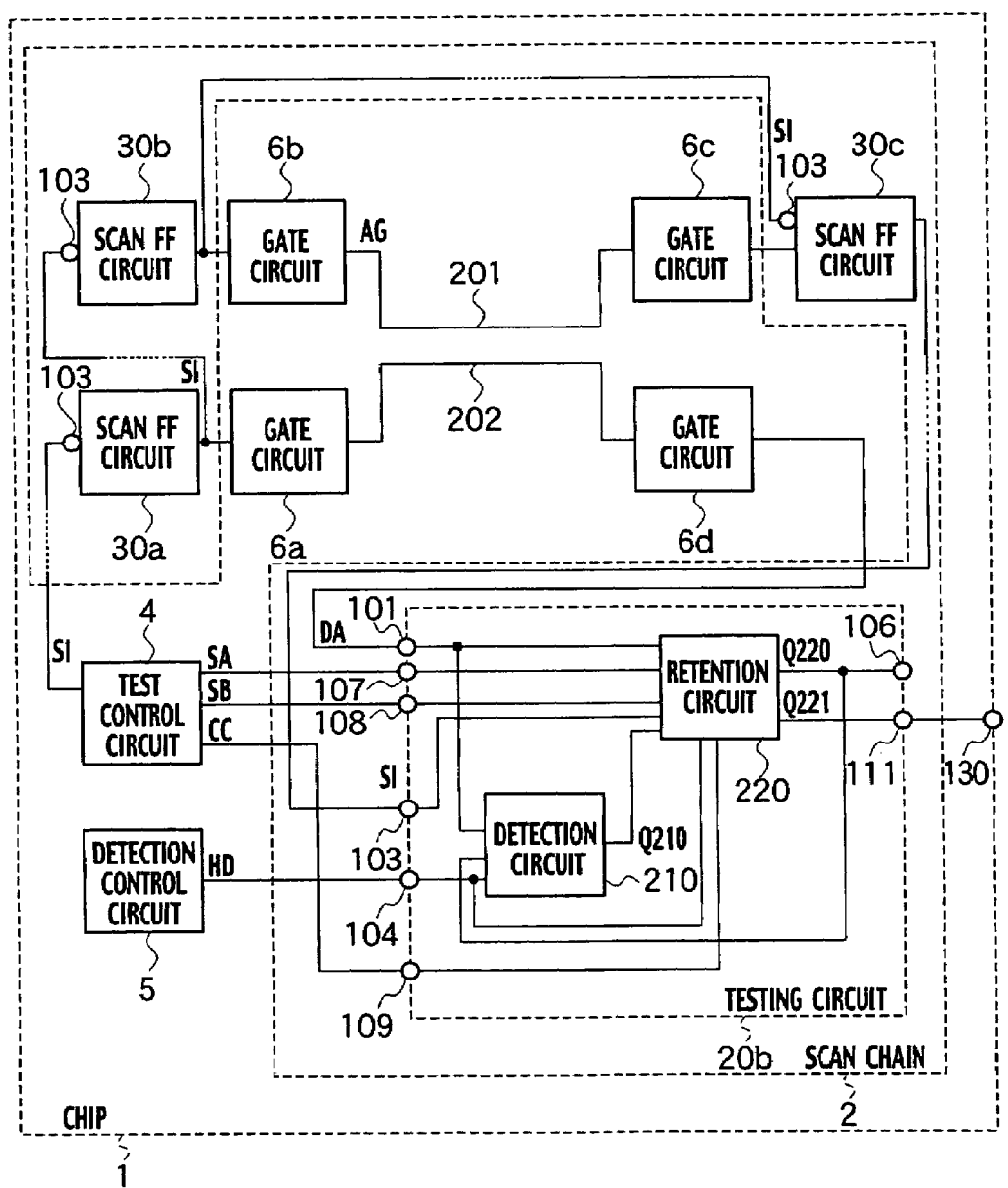
FIG. 13 is a block diagram showing the structure of the semiconductor integrated circuit according to a second modification of the present invention.
Figure 14:
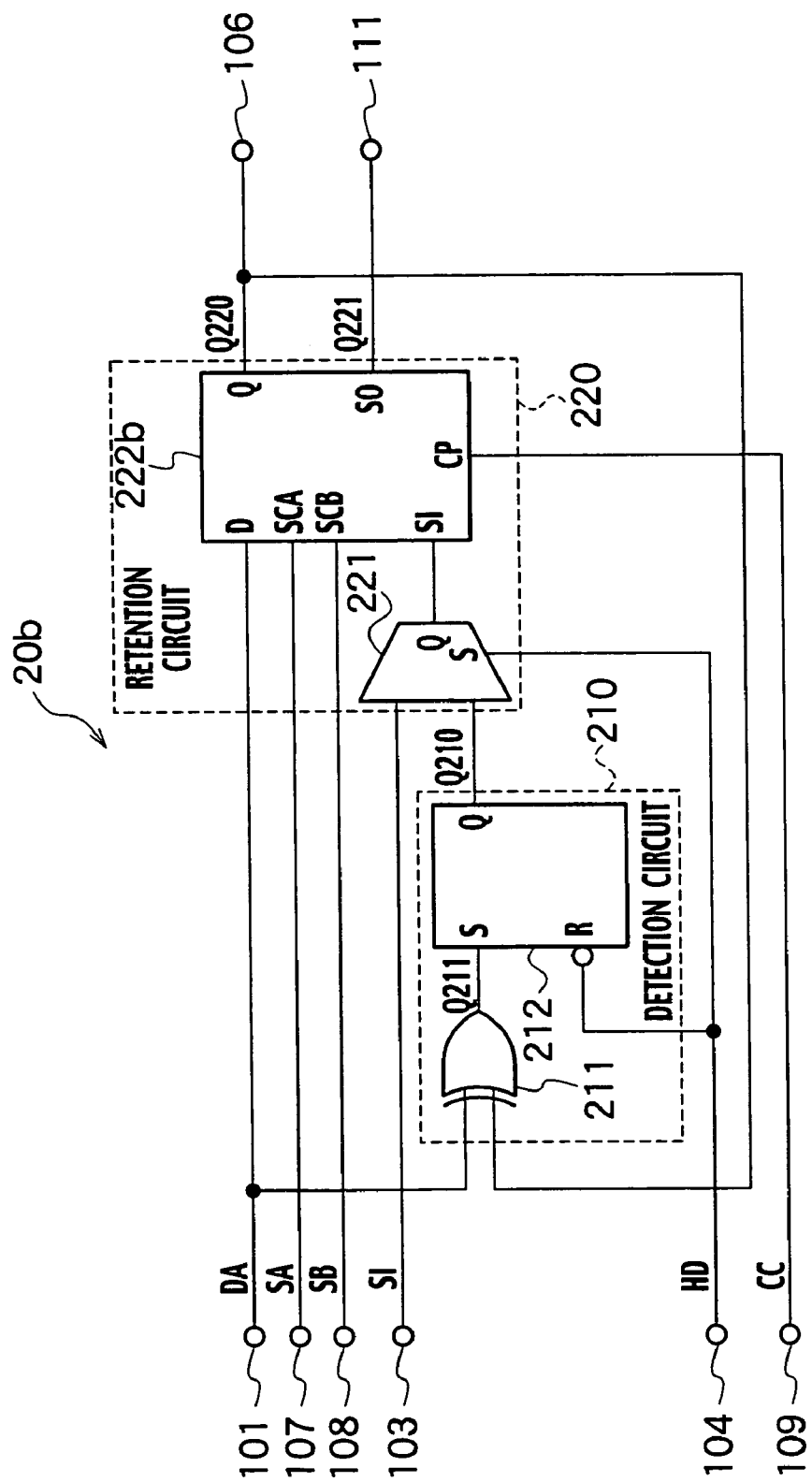
FIG. 14 is a block diagram showing part of the structure of the semiconductor integrated circuit according to the second modification of the present invention.

FIGS. 13 and 14 show a testing circuit 20b, which employs an independent 2 phase scan FF circuit (level sensitive scan design (LSSD) type scan FF circuit) 222b for the retention circuit 220, as the semiconductor integrated circuit according to a second modification of the embodiment of the present invention.

The control technique for the independent 2 phase scan FF circuit 222b shown in FIG. 14 differs with the common single phase scan FF circuit 222 shown in FIG. 2. In order to control operation of the independent 2 phase scan FF circuit 222b, the test control circuit 4 delivers a master clock SA, a slave clock SB, and a capture clock CC, as shown in FIG. 13. The master clock SA is input to the testing circuit 20b through a scan clock terminal 107. The slave clock SB is input to the testing circuit 20b through a scan clock B terminal 108. And the capture clock CC is input to the testing circuit 20b through a capture clock terminal 109. FIG. 13 shows an example in which the testing circuit 20b is the last stage of the scan chain 2, and the external terminal 130 is connected to a scan signal output terminal 111. Because of this, it is possible to read out scan test results from the external terminal 130.

As shown in FIG. 14, the data terminal D of the independent 2 phase scan FF circuit 222b is connected to the data signal terminal 101, a master clock terminal SCA is connected to the scan clock A terminal 107, a slave clock terminal SCB is connected to the scan clock B terminal 108, and the scan input terminal SI is connected to the output terminal Q of the multiplexer 221. Further, a clock terminal CP is connected to the capture clock terminal 109, a data output terminal Q, is connected to the data signal output terminal 106, and a scan output terminal is connected to the scan signal output terminal 111. The output signal Q220 of the data output terminal Q of the independent 2 phase scan FF circuit 222*b* is controlled by the master clock SA, an output signal Q221 of a scan output terminal SO is controlled by the slave clock SB. Other structural points are identical to that of FIGS. 1 and 2.

Below, a method of detecting glitch noise using the testing circuit 20*b* shown in FIG. 14 will be described while referencing the time chart shown in FIGS. 15A to 15J.

Figure 15:
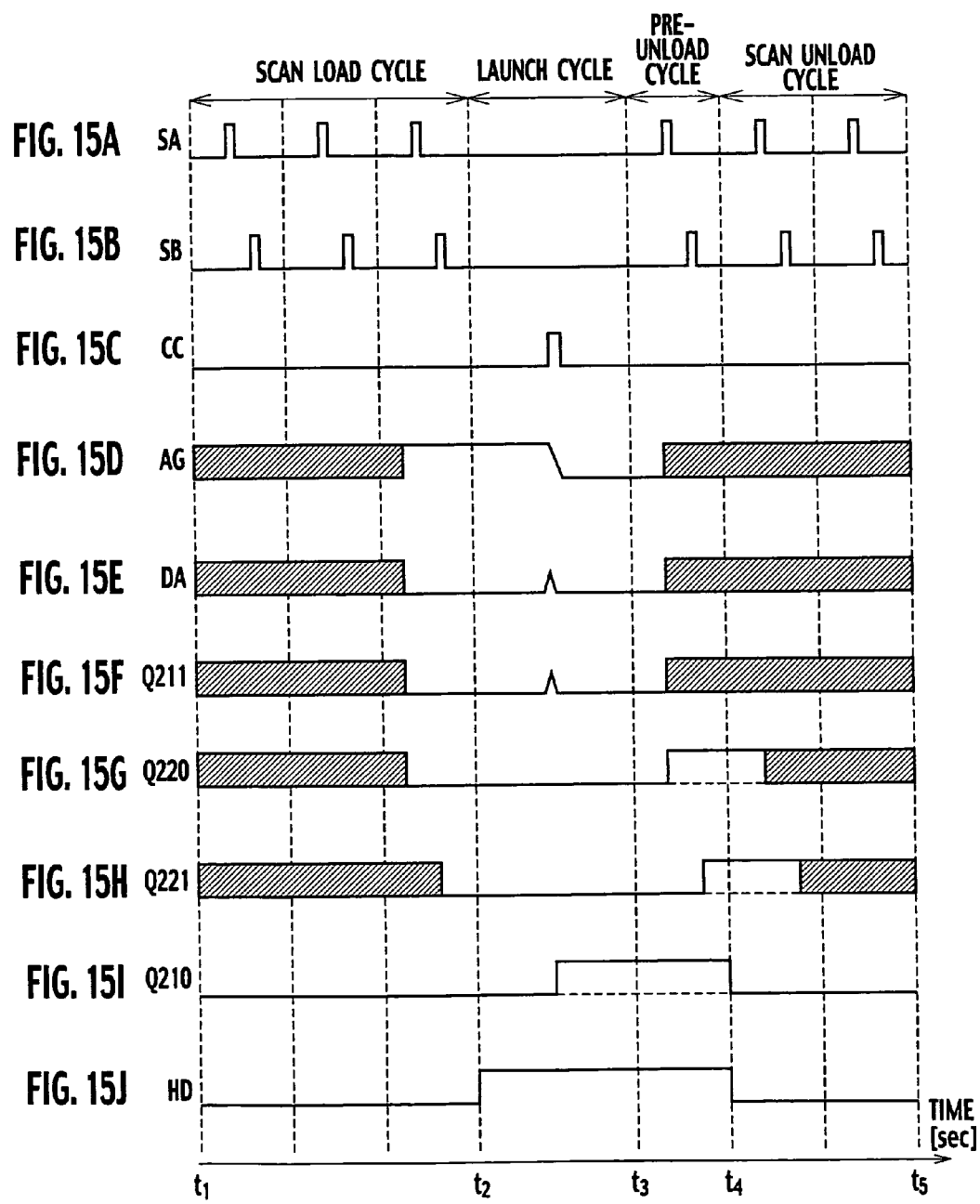
FIGS. 15A to 15J are timing charts explaining the test method used on the semiconductor integrated circuit according to the second modification of the present invention.

(a) In the scan load cycle of FIG. 15, a value held at the latch circuit 212, the data signal DA, the output signal Q220 of the data output terminal Q of the independent 2 phase scan FF circuit 222*b* are set.

(b) In the launch cycle, the signal AG of the wiring 201 is changed under control of the capture clock CC. At this time, the master clock SA and the slave clock SB are set in order that the value held at the independent 2 phase scan FF circuit 222*b* is not changed.

(c) In the same manner as in the test method shown in FIG. 2, determination of whether or not glitch noise occurs in the data signal DA is executed, and the level of the output signal Q210 of the latch circuit 212 is set.

(d) In the pre-unload cycle, the Q120 of the latch circuit 212 is input to the independent 2 phase scan FF circuit 222*b* under control of the master clock SA and the slave clock SB.

(e) In the scan unload cycle, a value held at the independent 2 phase scan FF circuit 222*b* is read out from the external terminal 130 using the scan chain 2.

In the same manner as in the test method according to the testing circuit 20 shown in FIG. 2, if the value held at the independent 2 phase scan FF circuit 222*b* is at a high level, it is determined that glitch noise occurs in the data signal DA. And according to the testing circuit 20*b* shown in FIG. 14, it is possible to detection if glitch noise, caused by crosstalk influence, is occurring in the data signal DA, and hold detection results in the independent 2 phase scan FF circuit 222*b* regardless of the timing window in the independent 2 phase scan FF circuit 222*b* scan testing. It is also possible to read out detection results held at the independent 2 phase scan FF circuit 222*b* using the scan chain 2.

In the description put forth herein above, a case in which the data output terminal Q of the independent 2 phase scan FF circuit 222*b* is connected to an input terminal of the EXOR circuit 211 has been described. However, even if scan output terminal SO of the independent 2 phase scan FF circuit 222*b* is connected to an input terminal of the 211, it is possible to detect occurrences of glitch noise in the data signal DA, in the same manner as in the method described above. Other points are fundamentally identical to the testing circuit 20 shown in FIG. 2, and so redundant mention has been omitted.

<Third Modification>

Figure 16:
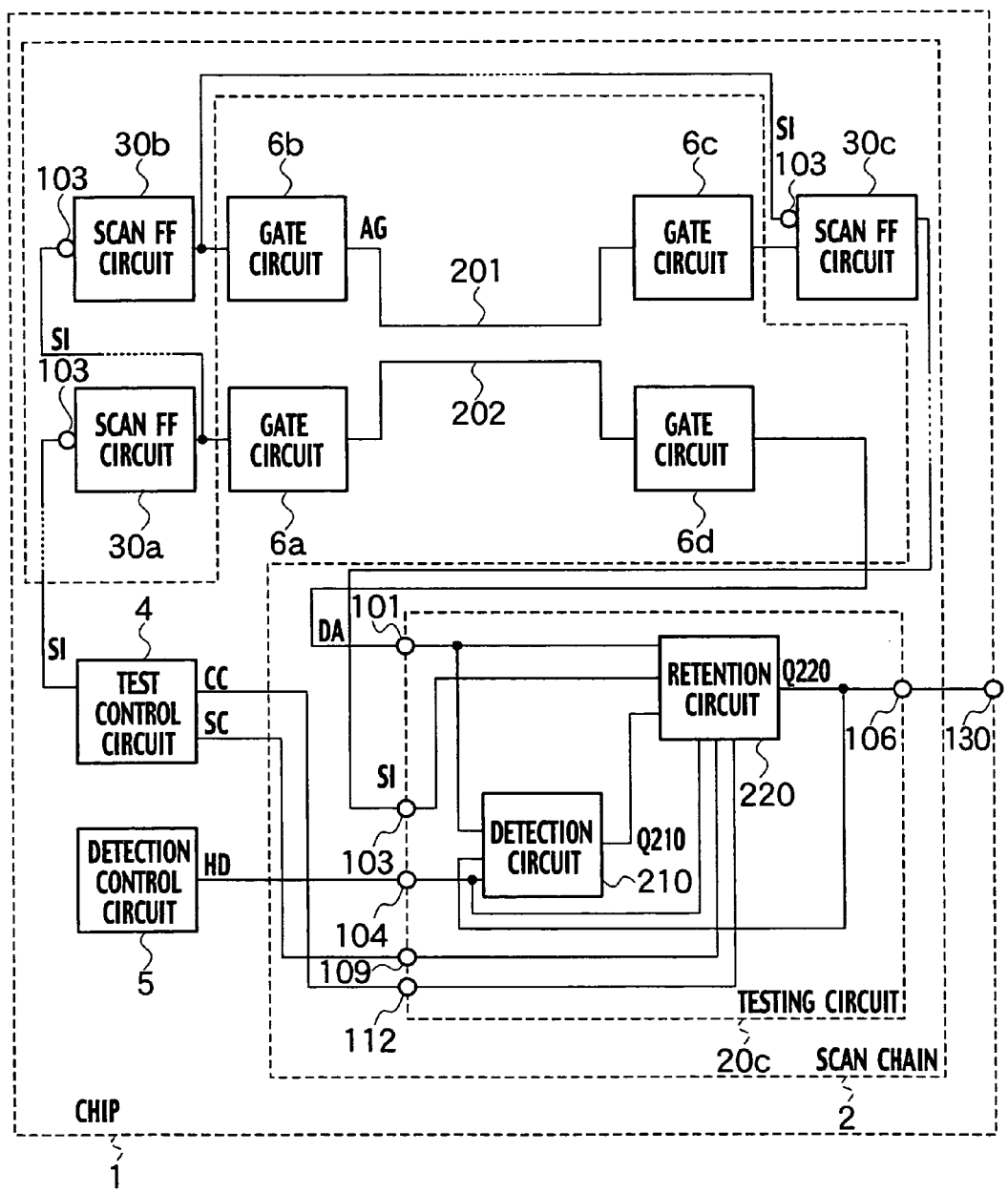
FIG. 16 is a block diagram showing the structure of the semiconductor integrated circuit according to a third modification of the present invention.
Figure 17:
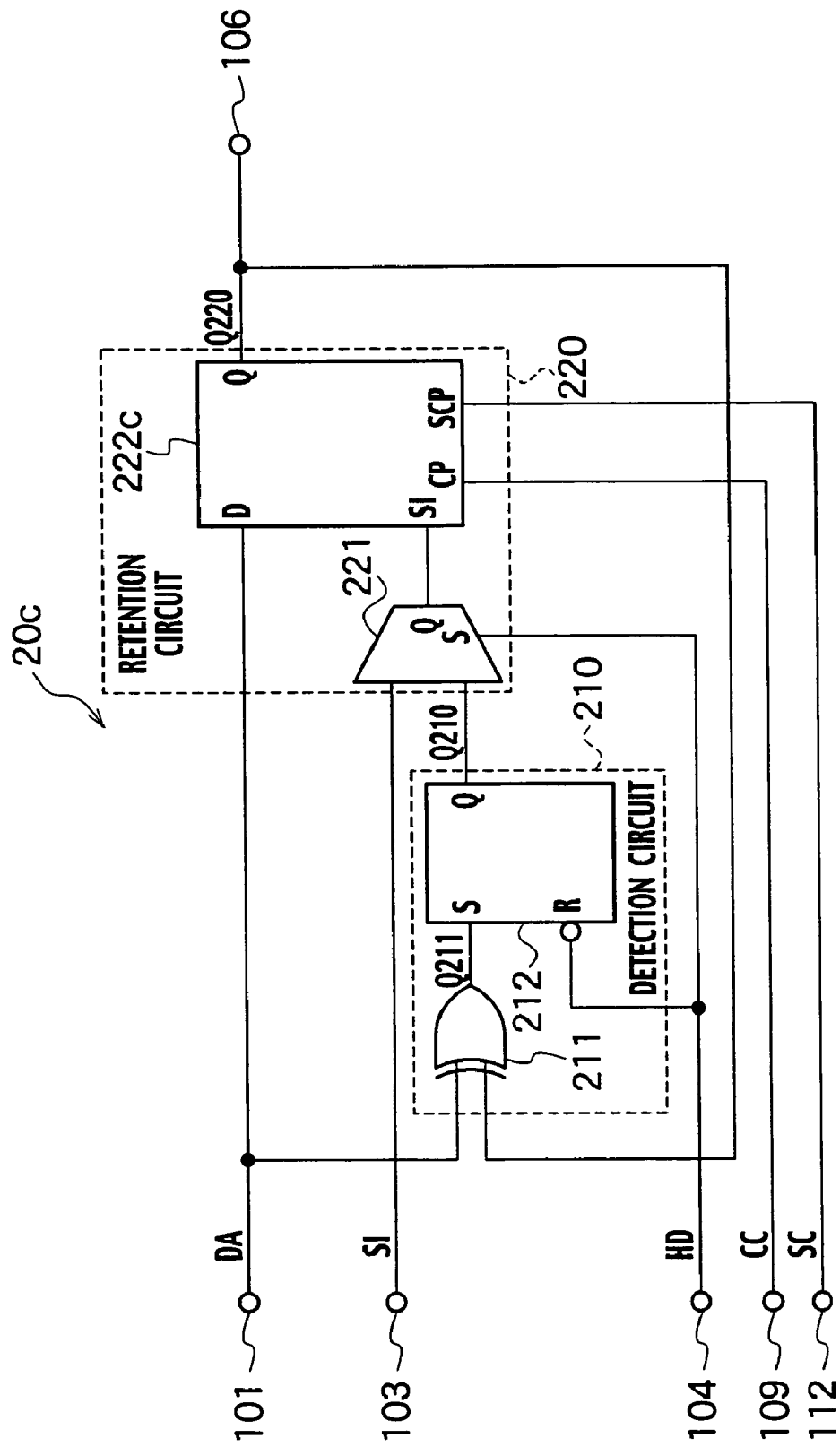
FIG. 17 is a block diagram showing part the structure of the semiconductor integrated circuit according to the third modification of the present invention.

FIGS. 16 and 17 show a testing circuit 20*c*, which employs a clocked scan FF circuit 222*c* for the retention circuit 220, as the semiconductor integrated circuit according to a third modification of the embodiment of the present invention.

The control technique for the clocked scan FF circuit 222*c* shown in FIG. 17 differs with the common single phase scan FF circuit 222 shown in FIG. 2. In order to control operation of the clocked scan FF circuit 222*c*, the test control circuit 4 delivers the capture clock CC, and a scan clock signal SC as shown in FIG. 16. The capture clock CC is input to the testing circuit 20*c* through the capture clock terminal 109, and the scan clock signal SC is input to the testing circuit 20*c* though a scan clock terminal 112.

And as shown in FIG. 17, a data terminal D of the clocked scan FF circuit 222*c* is connected to the data signal terminal 101, the scan signal SI is connected to the output terminal Q of the multiplexer 221, the clock terminal CP is connected to the capture clock terminal 109, and a scan clock terminal SCP is connected to the scan clock terminal 112. Further, the output terminal Q is connected to the data signal output terminal 106. The output signal Q220 of the output terminal Q of the clocked scan FF circuit 222*c* is under control of the scan clock signal SC. Other structural points are identical to those of FIGS. 1 and 2.

Below, a method of detecting glitch noise using the testing circuit 20*c* shown in FIG. 17 will be described while referencing the time chart shown in FIG. 18

Figure 18:
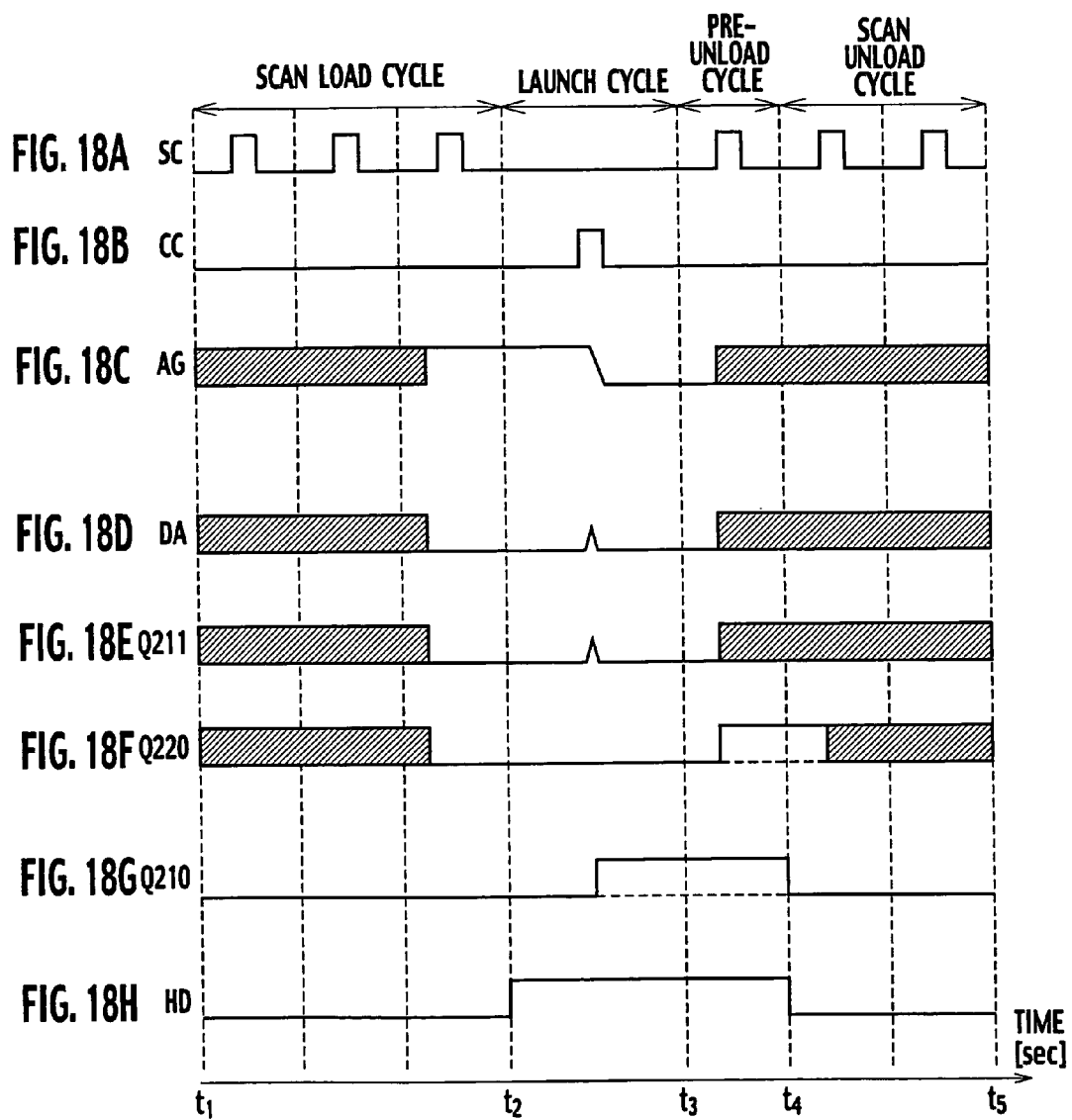
FIGS. 18A to 18H are timing charts explaining the test method used on the semiconductor integrated circuit according to the third modification of the present invention.

(a) In the scan load cycle of FIG. 18, a value held at the latch circuit 212, the data signal DA, the output signal Q220 of the data output terminal Q of the clocked scan FF circuit 222*c* are set.

(b) In the launch cycle, the signal AG of the wiring 201 is changed under control of the capture clock CC. At this time, the scan clock signal SC is set in order that the value held at the clocked scan FF circuit 222*c* is not changed.

(c) Next, in the same manner as in the test method shown in FIG. 2, determination of whether or not glitch noise occurs in the data signal DA is executed, and the level of the output signal Q210 of the latch circuit 212 is set.

(d) In the pre-unload cycle, the Q120 of the latch circuit 212 is input to the clocked scan FF circuit 222*c* under control of the scan clock signal SC.

(e) In the scan unload cycle, a value held at the clocked scan FF circuit 222*c* is read out from the external terminal 130 using the scan chain 2.

In the same manner as in the test method according to the testing circuit 20 shown in FIG. 2, if the value held at the clocked scan FF circuit 222*c* is at a high level, it is determined that glitch noise occurs in the data signal DA. And according to the testing circuit 20*c* shown in FIG. 17, it is possible to detection if glitch noise, caused by crosstalk influence, is occurring in the data signal DA, and hold detection results in the clocked scan FF circuit 222*c* regardless of the timing window in the clocked scan FF circuit 222*c* scan testing. It is also possible to read out detection results held at the clocked scan FF circuit 222*c* using the scan chain 2. Other points are fundamentally identical to the testing circuit 20 shown in FIG. 2, and so redundant mention has been omitted.

Other Embodiments

In the description of the embodiment put forth hereinabove, the detection circuit 210 is connected to all wirings that can possibly become victim wiring. However, it is also possible to connect a plurality of wirings that can possibly become victim wiring to an EXOR circuit or a selector circuit, and subsequently connect to a single detection circuit 210. As a result, it is possible to control the number of the detection circuits 210 integrated in the chip 1 as a whole.

Also, in the description of the embodiment, although an example in which the signal input into the reset terminal R of the latch circuit 212, and the signal input into the select terminal S of the multiplexer are the hold control signal HD has been described, it is acceptable to implement another type of signal.

Figure 19:
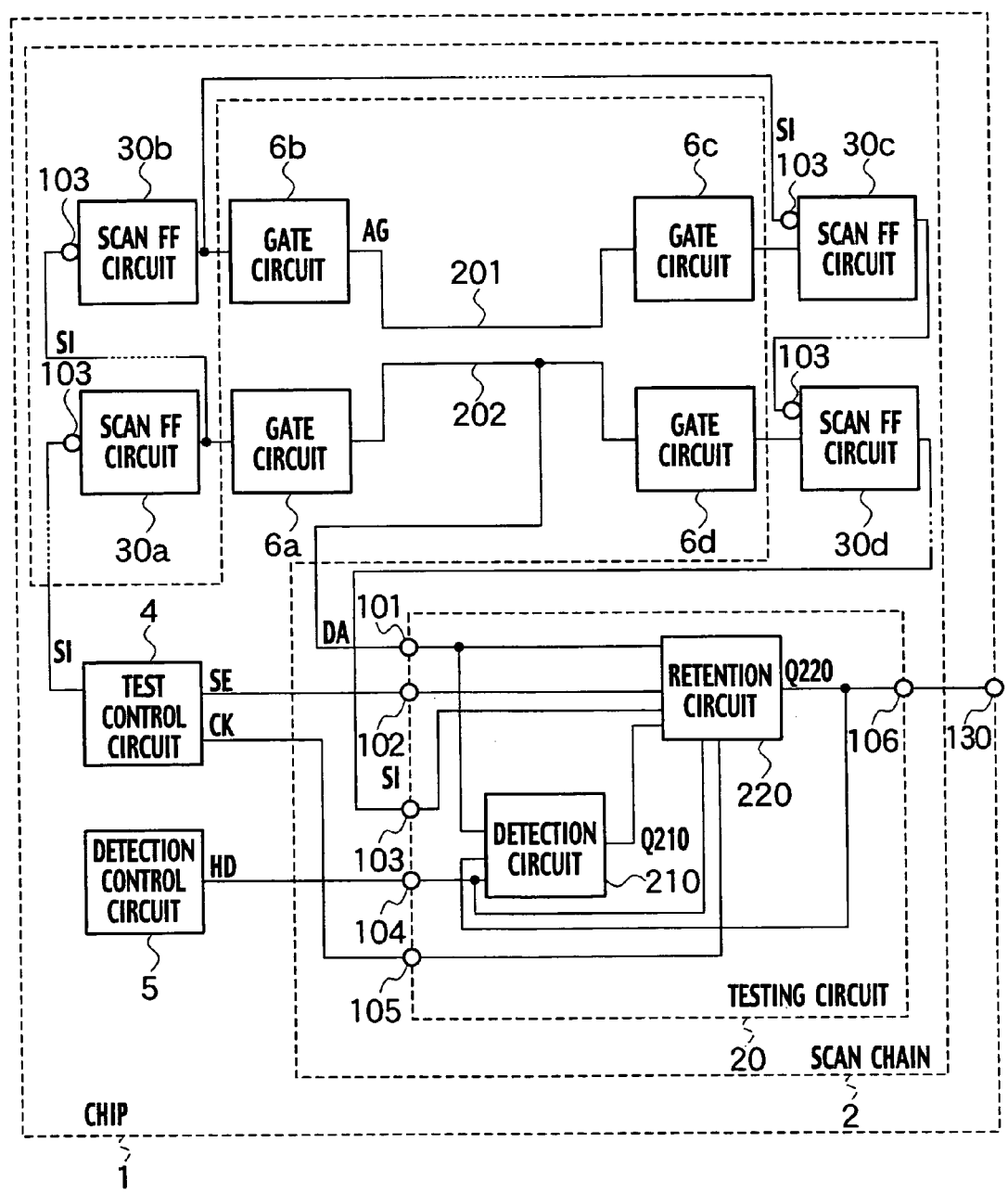
FIG. 19 is a block diagram showing the structure of the semiconductor integrated circuit according to other embodiments of the present invention.

Further, in the description of the embodiment, an example in which occurrences of glitch noise caused by crosstalk influence are detected by the testing circuit 20 connected to the scan chain 2 in order to execute scan testing. However, there exist cases in which the structure of the gate circuit 6d shown in FIG. 1, for example, is complicated, thus making it difficult to propagate glitch noise occurring in the test-subject wiring 202 through the testing circuit 20. In such a case, a scan FF circuit 30d is connected to the gate circuit 6d in order to execute scan testing, as shown in FIG. 19. Then the testing circuit 20 is connected to the test-subject wiring 202. Other structural points of FIG. 19 are identical to those of FIG. 1. By connecting the testing circuit 20 to the test-subject wiring 202, it is possible to detect glitch noise occurring in the test-subject wiring 202 with the testing circuit 20. And by adding the scan chain 2 to the testing circuit 20 shown in FIG. 19, it is possible to read out glitch noise held at the testing circuit 20 from the external terminal 130 using the scan chain 2.

Various modifications will become possible for those skilled in the art after receiving the teachings of the present disclosure without departing from the scope thereof.

What is claimed is:

1. A semiconductor integrated circuit having a plurality of wirings and a scan chain including a testing circuit configured to detect glitch noise caused by crosstalk between the wirings and a plurality of scan flip-flops connected in series, the testing circuit comprising:
    a retention circuit configured to receive a data signal propagating a test-subject wiring; and
    a detection circuit configured to receive the data signal and an output signal of the retention circuit, to detect glitch noise occurring in the data signal, and to deliver an output signal to the retention circuit.

2. The semiconductor integrated circuit of claim 1, wherein the retention circuit comprises:
    a flip-flop configured to receive the data signal; and
    a multiplexer configured to select one of the output signal of the detection circuit and a scan signal propagating the scan chain, and to deliver the selected signal to the flip-flop.

3. The semiconductor integrated circuit of claim 2, wherein the multiplexer selects the output signal of the detection circuit in a test detecting the glitch noise, and selects the scan signal in the scan test.

4. The semiconductor integrated circuit of claim 1, wherein the detection circuit comprises:
    an exclusive OR circuit configured to receive the data signal and the output signal of the retention circuit; and
    a memory circuit configured to hold an output signal of the exclusive OR circuit.

5. The semiconductor integrated circuit of claim 4, wherein the glitch noise is detected as a change in the output signal of the memory circuit.

6. The semiconductor integrated circuit of claim 5, wherein the output signal of the memory circuit changes when size of the glitch noise is larger than a threshold value of the exclusive OR circuit.

7. The semiconductor integrated circuit of claim 1, wherein the detection circuit receives one of a plurality of output signals the retention circuit delivers.

8. The semiconductor integrated circuit of claim 1, wherein the test subject wiring is connected to the retention circuit.

9. The semiconductor integrated circuit of claim 1, wherein the output signal of the retention circuit propagates the scan chain.

10. The semiconductor integrated circuit of claim 1, wherein the output signal of the retention circuit is delivered from an external terminal of the semiconductor integrated circuit.

11. A method of testing a semiconductor integrated circuit, detecting glitch noise caused by crosstalk between a plurality of wirings, the method comprising:
    setting an output signal of a retention circuit configured to receive a data signal propagating in a test-subject wiring to a same level as the data signal, the retention circuit being included in a scan chain;
    changing signal level of one of the plurality of wirings causing crosstalk influence on the data signal;
    feeding the data signal and the output signal of the retention circuit into an exclusive OR circuit;
    storing an output signal of the exclusive OR circuit in a memory circuit configured to hold the output signal of the exclusive OR circuit;
    detecting glitch noise occurring in the data signal; and
    feeding a signal held in the memory circuit into the retention circuit.

12. The method of claim 11, wherein setting the output signal of the retention circuit comprises:
    setting a multiplexer of the retention circuit so that the multiplexer delivers a scan signal propagating the scan chain.

13. The method of claim 11, wherein detecting glitch noise comprises:
    setting a multiplexer of the retention circuit so that the multiplexer delivers a signal transferred from the memory circuit.

14. The method of claim 11, wherein the glitch noise is detected as a change in the output signal of the memory circuit.

15. The method of claim 14, wherein the output signal of the memory circuit changes when size of the glitch noise is larger than a threshold value of the exclusive OR circuit.

16. The method of claim 11, wherein the output signal of the retention circuit propagating the scan chain.

17. The method of claim 11, wherein the output signal of the retention circuit is delivered from an external terminal of the semiconductor integrated circuit.

* * * * *